(12) United States Patent
Cui et al.

(10) Patent No.: US 12,105,922 B2
(45) Date of Patent: Oct. 1, 2024

(54) TOUCH PANEL, MANUFACTURING METHOD THEREOF AND DISPLAY PANEL

(71) Applicants: Chengdu BOE Optoelectronics Technology Co., Ltd., Sichuan (CN); BOE Technology Group Co., Ltd., Beijing (CN)

(72) Inventors: Guoyi Cui, Beijing (CN); Peng Hou, Beijing (CN); Yang Yang, Beijing (CN); Xiaoqi Ding, Beijing (CN); Huaisen Ren, Beijing (CN); Jie Li, Beijing (CN); Li Jia, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/363,011

(22) Filed: Aug. 1, 2023

(65) Prior Publication Data
US 2024/0019972 A1    Jan. 18, 2024

Related U.S. Application Data

(63) Continuation-in-part of application No. 17/631,297, filed as application No. PCT/CN2021/086542 on Apr. 12, 2021, now Pat. No. 11,755,162.

(30) Foreign Application Priority Data

May 11, 2020    (CN) .......................... 202010391972.3

(51) Int. Cl.
*G06F 3/044* (2006.01)
*H10K 59/38* (2023.01)
(Continued)

(52) U.S. Cl.
CPC ........... *G06F 3/0446* (2019.05); *H10K 59/38* (2023.02); *H10K 59/40* (2023.02); *H10K 59/88* (2023.02); *G06F 2203/04111* (2013.01)

(58) Field of Classification Search
CPC . G06F 2203/04103; G06F 2203/04111; G06F 2203/04112; G06F 3/0412;
(Continued)

(56) References Cited

U.S. PATENT DOCUMENTS

| | | |
|---|---|---|
| 2008/0204377 A1 | 8/2008 | Kajiyama |
| 2012/0218485 A1* | 8/2012 | Chikama ........... G02F 1/136213 349/39 |

(Continued)

FOREIGN PATENT DOCUMENTS

| | | |
|---|---|---|
| CN | 103425327 A | 12/2013 |
| CN | 103927046 A | 7/2014 |

(Continued)

OTHER PUBLICATIONS

WIPO, International Search Report issued on Jun. 2, 2021.
(Continued)

*Primary Examiner* — Insa Sadio
(74) *Attorney, Agent, or Firm* — HOUTTEMAN LAW LLC

(57) ABSTRACT

The touch panel includes a base which has a black matrix thereon, and openings in the black matrix and spaced from each other, the touch panel is divided into first regions and second regions, a portion of a touch structure is arranged in a first part of the openings and in the first regions; a color
(Continued)

filter layer is arranged in a second part of the openings and in the second regions; the first regions include first sub-regions and second sub-regions, first electrodes for forming the touch structure are arranged in the first sub-regions, and second electrodes for forming the touch structure are arranged in the second sub-regions; each first electrode include two electrode bodies and a bridge electrode connecting the two electrode bodies together; and an insulating layer is arranged in the first part of the openings and is made of a material of the color filter layer.

20 Claims, 10 Drawing Sheets

(51) Int. Cl.
*H10K 59/40* (2023.01)
*H10K 59/88* (2023.01)

(58) Field of Classification Search
CPC .... G06F 3/0446; H10K 50/84; H10K 50/865; H10K 59/122; H10K 59/38; H10K 59/40
See application file for complete search history.

(56) References Cited

U.S. PATENT DOCUMENTS

| | | | |
|---|---|---|---|
| 2016/0246426 | A1* | 8/2016 | Zhan ................. G02F 1/136227 |
| 2019/0005923 | A1 | 1/2019 | Kim |

FOREIGN PATENT DOCUMENTS

| | | |
|---|---|---|
| CN | 109343735 A | 2/2019 |
| CN | 109407870 A | 3/2019 |
| CN | 109669578 A | 4/2019 |
| CN | 110471569 A | 11/2019 |
| CN | 110658959 A | 1/2020 |
| CN | 110989862 A | 4/2020 |
| CN | 111580698 A | 8/2020 |

OTHER PUBLICATIONS

China Patent Office, CN202010391972.3 First Office Action issued on Feb. 24, 2023.
USPTO, U.S. Appl. No. 17/631,297 Notice of Allowance issued on May 2, 2023.
USPTO, U.S. Appl. No. 17/631,297 Corrected Notice of Allowance issued on Jun. 1, 2023.

* cited by examiner

TOUCH PANEL, MANUFACTURING METHOD THEREOF AND DISPLAY PANEL

CROSS-REFERENCE TO RELATED APPLICATIONS

The present application is a continuation-in-part (CIP) application of the U.S. patent application Ser. No. 17/631,297, which is the U.S. national phase of the International Patent Application PCT/CN2021/086542, filed on Apr. 12, 2021 and claiming the priority of the Chinese Patent Application 202010391972.3, filed on May 11, 2020.

TECHNICAL FIELD

The present disclosure relates to the field of display technology, and in particular to a touch panel, a manufacturing method thereof and a display panel.

BACKGROUND

With the rapid development of OLED (Organic Light-Emitting Diode) display devices, people have higher requirements on being lighter, thinner, bendable and the like, while pursuing wide color gamut, bright color, curved surface, full-screen and the like.

SUMMARY

The embodiment of the present disclosure provides a touch panel, a manufacturing method thereof and a display panel.

In a first aspect, the embodiment of the present disclosure provides a touch panel, including a base, wherein the base includes a first region in a mesh shape and a second region which is a grid region surrounded by the first region; color filter layers are in the second region; a black matrix and touch structures are in the first region; the touch structures are partially in the black matrix; the touch structures each include a first electrode, a second electrode, and an insulating layer between the first electrode and the second electrode; and the insulating layer is made of a material same as a material of the color filter layer.

In some embodiments, the first electrode includes an electrode body and a bridge electrode, the black matrix has openings therein, the bridge electrode is in a corresponding opening of the openings, and the insulating layer and the electrode body are sequentially stacked on a side of the bridge electrode away from the base;

the bridge electrode is connected to the electrode body, and the electrode body and the second electrode are in a same layer and are spaced from each other.

In some embodiments, the color filter layers include red filter layers, green filter layers, and blue filter layers, the color filter layers are arranged in an array with a column direction being the first direction and a row direction being the second direction;

the red filter layers, the green filter layers and the blue filter layers are alternately arranged in sequence along the first direction; the red filter layers, the green filter layers and the blue filter layers are alternately arranged along the second direction;

surfaces of the color filter layers, the insulating layer and the black matrix away from the base are flush with each other.

In some embodiments, a color of the insulating layer, on both sides of any color filter layer and adjacent to this color filter layer of any color along both the first direction and the second direction, is different from a color of this color filter layer.

In some embodiments, the insulating layer includes a first sub-portion and a second sub-portion; the first sub-portion and the second sub-portion are sequentially arranged along the first direction, and the first sub-portion and the second sub-portion are sequentially arranged along the second direction;

colors of materials of the first sub-portion and the second sub-portion are different, and the colors of the first sub-portion and the second sub-portion, on both sides of any color filter layer and adjacent to this color filter layer along both the first direction and the second direction, are different from a color of this color filter layer.

In some embodiments, the insulating layer includes a first sub-portion, a second sub-portion, and a third sub-portion; and the first sub-portion, the second sub-portion, and the third sub-portion are sequentially arranged along the first direction; and the first sub-portion, the second sub-portion and the third sub-portion are sequentially arranged along the second direction;

colors of materials of the first sub-portion, the second sub-portion and the third sub-portion are different, and the colors of the first sub-portion, the second sub-portion and the third sub-portion, on both sides of any color filter layer and adjacent to this color filter layer along both the first direction and the second direction, are different from a color of this color filter layer.

In some embodiments, the insulating layer includes a first sub-portion, a second sub-portion, and a third sub-portion which are sequentially stacked in a direction away from the base;

colors of materials of the first sub-portion, the second sub-portion and the third sub-portion are different from each other.

In some embodiments, surfaces of the color filter layers, the black matrix, and the insulating layer away from the base are uneven rough surfaces.

In some embodiments, a protective layer is further included, and is on a side of the touch structures and the color filter layers away from the base.

In a second aspect, the embodiment of the present disclosure provides a display panel including a display substrate, wherein the display substrate includes a pixel definition region and a pixel region defined by the pixel definition region, and the display panel further includes the above touch panel, wherein the touch panel is on a display side of the display substrate, and the first region of the touch panel corresponds to the pixel definition region, and the second region of the touch panel corresponds to the pixel region.

In some embodiments, the display substrate includes a base substrate, and a pixel driving circuit and light emitting elements sequentially on the base substrate, wherein the light emitting elements are in the pixel region, and the pixel driving circuit is connected to the light emitting elements to drive the light emitting elements to emit light.

In some embodiments, a light emitting element emits light of a same color as a color of the color filter layer in the second region corresponding to this light emitting element.

In some embodiments, the display substrate further includes an encapsulation layer on a side of the light emitting elements away from the base substrate and for encapsulating the light emitting elements.

In some embodiments, the base of the touch panel acts as an encapsulation layer of the display substrate, and the encapsulation layer is used for encapsulating the light emitting elements.

In a third aspect, the embodiment of the present disclosure provides a manufacturing method of a touch panel including a base, the base includes a first region in a mesh shape and a second region which is a grid region surrounded by the first region; the manufacturing method includes forming color filter layers in the second region; and forming a black matrix and touch structures in the first region such that the touch structures are partially in the black matrix; the touch structures each include a first electrode, a second electrode, and an insulating layer between the first electrode and the second electrode; and the insulating layer is made of a material same as a material of the color filter layer.

In some embodiments, the first electrode includes an electrode body and a bridge electrode; the color filter layers include red filter layers, green filter layers and blue filter layers; the manufacturing method of the touch panel includes: forming a pattern of the black matrix provided with openings in the first region through one process; forming a pattern of the bridge electrode in a corresponding opening of the openings; sequentially forming color filter layers of different colors while sequentially forming insulating layers of different colors; wherein the color filter layers are formed in the second region, and the insulating layers are formed in the first region; the color filter layers and the insulating layers of a same color are formed through one process; forming patterns of the electrode body and the second electrode through one process such that the electrode body is connected to the bridge electrode; or the first electrode includes an electrode body and a bridge electrode; the color filter layers include red filter layers, green filter layers and blue filter layers; the insulating layer includes a first sub-portion and a second sub-portion of different colors or the insulating layer includes a first sub-portion, a second sub-portion, and a third sub-portion of different colors; the manufacturing method of the touch panel includes: forming a pattern of the black matrix provided with openings in the first region through one process; forming a pattern of the bridge electrode in a corresponding opening of the openings; sequentially forming color filter layers of different colors while sequentially forming sub-portions of the insulating layer of different colors such that the color filter layers are formed in the second region, and the sub-portions of the insulating layer are formed in the first region; the color filter layers and the sub-portion of the insulating layer of the same color are formed through one process; and forming patterns of the electrode body and the second electrode through one process such that the electrode body is connected to the bridge electrode.

BRIEF DESCRIPTION OF DRAWINGS

The accompanying drawings, which are provided for further understanding of the present disclosure and constitute a part of this specification, are for explaining the present disclosure together with the following exemplary embodiments, but are not intended to limit the present disclosure. The above and other features and advantages will become more apparent to one of ordinary skill in the art by describing in detail exemplary embodiments thereof with reference to the drawings. In the drawings.

Figure 1:
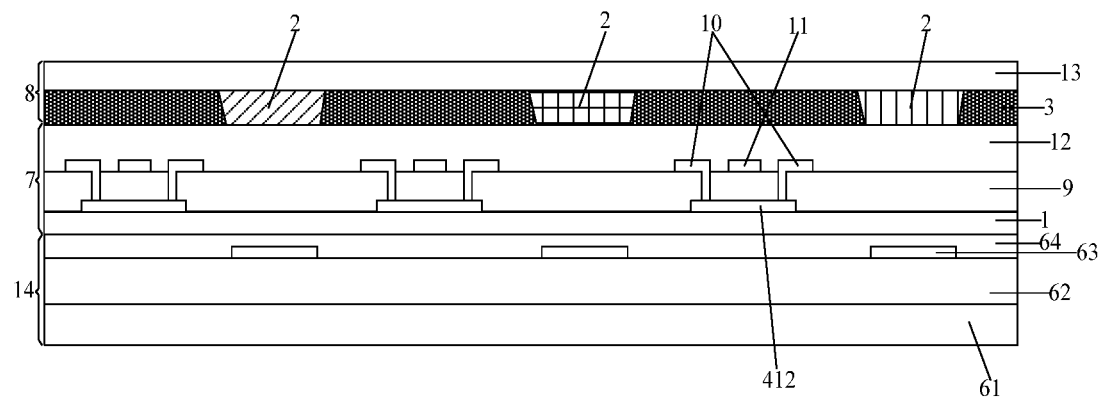
FIG. 1 is a sectional view showing a structure of an OLED display device in the related art.

Reference numbers are:

1. a base; 101. a first region; 102. a second region; 1011. a first sub-region; 1012. a second sub-region; 416. a dummy bridge electrode; 4122. a dummy bridge electrode; 4123. a dummy bridge electrode; 2. a color filter layer; 21. a red filter layer; 22. a green filter layer; 23. a blue filter layer; 3. a black matrix; 30. an opening; 301. a bottom of the opening; 302. a slope of the opening; 4. a touch structure; 41. a first electrode; 411. an electrode body; 412. a bridge electrode; 42. a second electrode; 43. an insulating layer; 431. a first sub-portion; 432. a second sub-portion; 433. a third sub-portion; 5. a protective layer; 6. a display substrate; 61. a base; 62. a pixel driving circuit; 63. a light emitting element; 64. an encapsulation layer; 7. a touch panel; 8. an optical filter; 9. a silicon nitride insulating layer; a first touch electrode; 11. a second touch electrode; 12. a first planarization layer; 13. a second planarization layer; 14. an OLED display substrate; Y, a first direction; X, a second direction.

DETAIL DESCRIPTION OF EMBODIMENTS

In order to make one of ordinary skill in the art better understand the technical solutions of the embodiments of the present disclosure, a touch panel, a manufacturing method thereof, and a display panel provided in the embodiments of the present disclosure will be further described below in further detail with reference to the accompanying drawings and the detailed description.

The embodiments of the present disclosure will be described more fully hereinafter with reference to the accompanying drawings, but the embodiments shown may be embodied in different forms and should not be construed as being limited to the embodiments set forth herein. Rather, these embodiments are provided so that the present disclosure will be thorough and complete, and will fully convey the scope of the present disclosure to one of ordinary skill in the art.

The embodiments of the present disclosure are not limited to the embodiments shown in the drawings, but include modifications of configurations formed based on a manufacturing process. Thus, regions illustrated in the accompanying drawings have schematic properties, and shapes of the regions shown in the accompanying drawings illustrate specific shapes of the regions, but are not intended to be limiting.

In order to improve the color effect of an OLED display device, an optical filter is integrated on the OLED display device. In order to realize a touch display of the OLED display device, a touch panel is integrated on the OLED display device. However, in the currently disclosed technology, the touch panel and the optical filter are directly integrated on the OLED display device, which not only increases a thickness of the OLED display device, but also reduces a bending performance of the OLED display device, and also increases the number of manufacturing processes of the OLED display device, so that the manufacturing cost is increased; in addition, the touch panel is directly integrated on the OLED display device, which directly causes the thickness of the OLED display device to increase, such that signal lines of touch electrodes pass through a large height difference before they can be routed to a binding region of the OLED display device, the wirings are prone to open circuit or short circuit after a large height difference, adversely influencing the quality of the OLED display device.

In the related technology, layers of the OLED display device are arranged as shown in FIG. 1. An OLED display substrate 14 includes a base 61, and a pixel driving circuit 62, a light emitting element 63 and an encapsulation layer 64 sequentially disposed on the base 61. After the OLED display substrate 14 is encapsulated, a touch panel 7 and an optical filter 8 are directly manufactured on the encapsulation layer 64. Processes of manufacturing the touch panel 7 include sequentially forming a base 1, bridge electrodes 412, an insulating layer 9, first touch electrodes 10, second touch electrodes 11 and a first planarization layer 12 on the encapsulation layer 64; the first touch electrode 10 is connected to the corresponding bridge electrode 412 through a corresponding via formed in the insulating layer 9. Processes of manufacturing the optical filter 8 include: sequentially forming a pattern of the black matrix 3, patterns of color filter layers 2 of different colors, and a second planarization layer 13 on the display substrate on which the touch panel 7 is provided.

Therefore, for the structure of the OLED display device, the thickness of the OLED display device is increased, and the bending performance of the OLED display device is reduced, and the number of manufacturing processes of the OLED display device is also increased, so that the manufacturing cost is increased; in addition, the touch panel is directly integrated on the OLED display device, which causes the thickness of the OLED display device to increase, such that signal lines of touch electrodes pass through a large height difference before they can be routed to a binding region of the OLED display device, the wirings are prone to open circuit or short circuit after a large height difference, adversely influencing the quality of the OLED display device.

In order to solve the above problems caused by directly integrating the touch panel and the optical filter on the OLED display substrate, embodiments of the present disclosure provide a touch panel and a manufacturing method thereof, and a display panel and a manufacturing method thereof.

Figure 2:
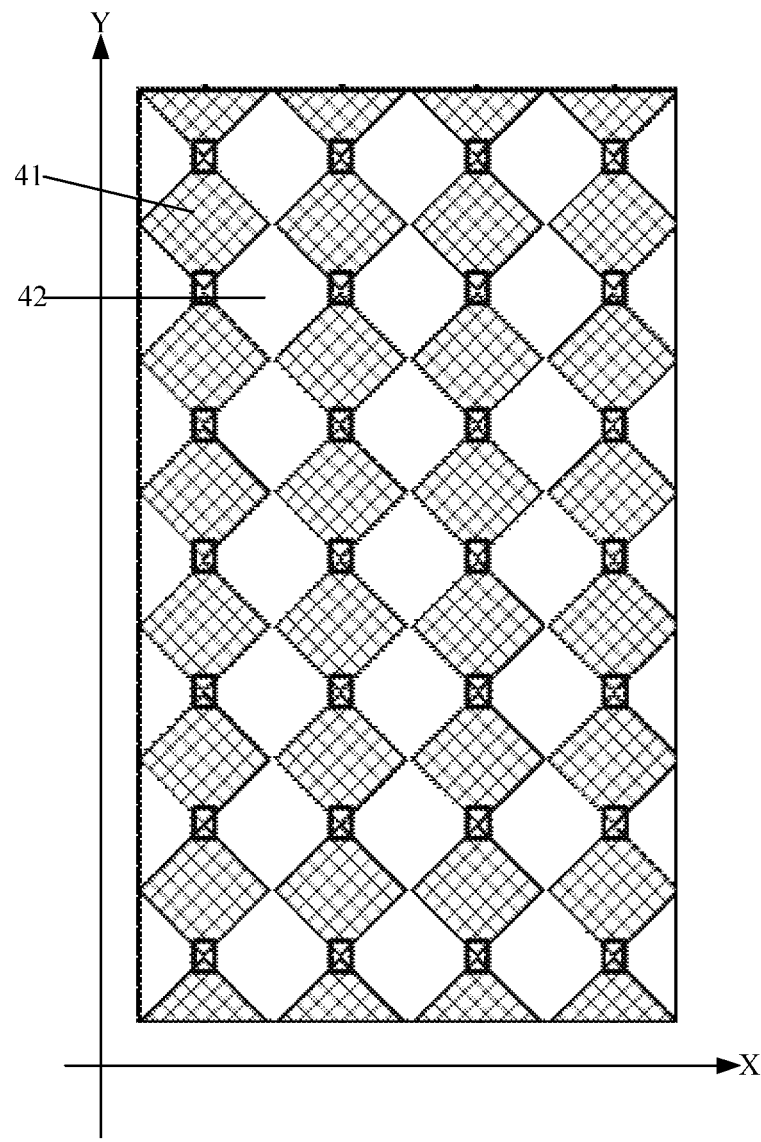
FIG. 2 is a macroscopic top view of a local structure of a touch panel according to an embodiment of the present disclosure.
Figure 3:
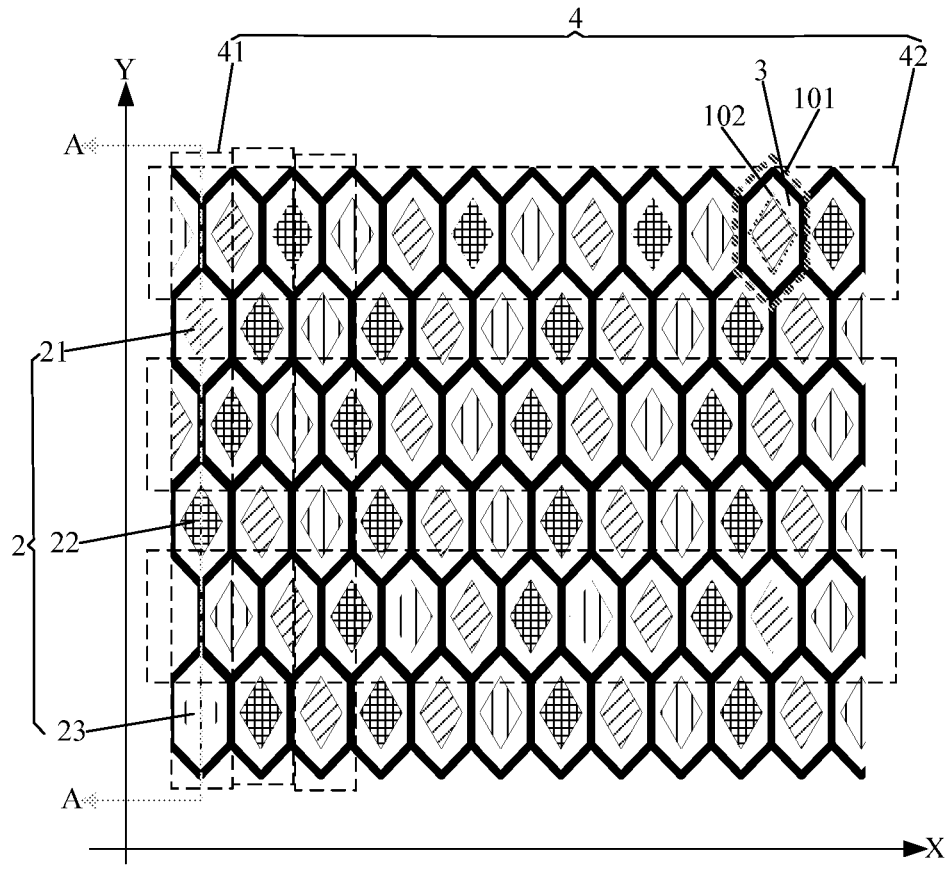
FIG. 3 is a microscopic top view of a partial structure of a touch panel according to an embodiment of the present disclosure.
Figure 4:
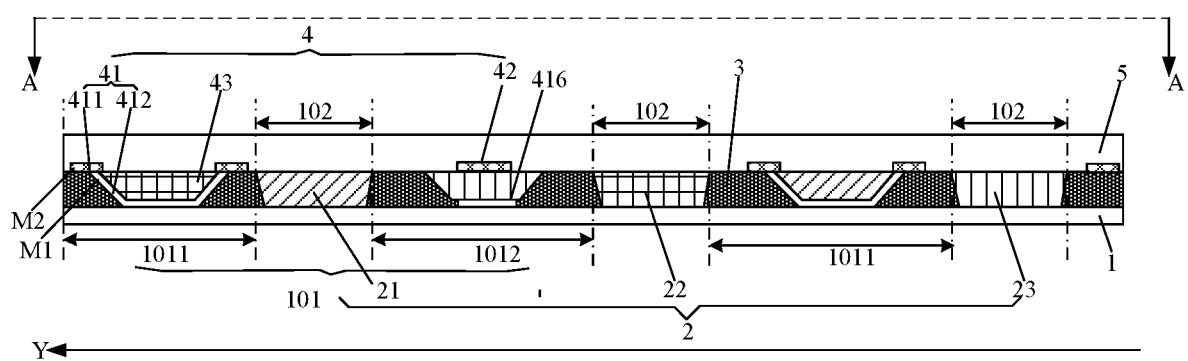
FIG. 4 is a cross-sectional view of the touch panel shown in FIG. 3 taken along a line AA.

In a first aspect, an embodiment of the present disclosure provides a touch panel, as shown in FIG. 2 to FIG. 4, which includes a base 1; the base 1 includes a plurality of first regions 101 and a plurality of second regions 102; the plurality of first regions 101 include a plurality of first sub-regions 1011 and a plurality of second sub-regions 1012; each of the plurality of second regions 102 is a grid region surrounded by corresponding ones of the plurality of first regions 101; a color filter layer 2 is disposed in the second region 102; a black matrix 3 and touch structures 4 are disposed in the first region 101; the touch structures 4 are partially located in the black matrix 3; a touch structure 4 includes a first electrode 41, a second electrode 42, and an insulating layer 43 filled in the first region 101; and the insulating layer 43 is made of a material same as that of the color filter layer 2.

The second region 102 corresponds to a pixel region; and the pixel regions are arranged in an array. That is, the color filter layers 2 are arranged in an array, and the second regions 102 are also arranged in an array. As shown in FIG. 2, from a macroscopic perspective, each first electrode 41 is a part of a mesh line of a mesh electrode unit (such as a touch driving electrode unit) extending in a column direction of the array, i.e., a first direction Y; each second electrode 42 is a part of a mesh line of a mesh electrode unit (such as a touch sensing electrode unit) extending in a row direction of the array, i.e., a second direction X; the first electrode 41 and the second electrode 42 are disposed at different positions and thus, are disconnected from each other to be insulated from each other; and the mesh electrode unit formed by the plurality of first electrodes and the mesh electrode unit formed by the plurality of second electrodes 42 may be separated from each other by the insulating layer 43 at bridging positions where the first electrode and the second electrode 42 cross each other, to be insulated from each other. As shown in FIG. 3, from a microscopic perspective, a microstructure of a part of the first electrode 41 and a part of the second electrode 42 is shown. The microstructure of the part of the first electrode 41 and the microstructure of the part of the second electrode 42 shown in FIG. 3 are only one structural arrangement of the touch structure 4; and the microstructure of the part of the first electrode 41 and the microstructure of the part of the second electrode 42 may also be another structural arrangement, and are not limited to the one structural arrangement in FIG. 3. For example, the first electrode and the second electrode may have a microstructure of mesh electrode lines as a piece or the like, provided in the first region.

The touch panel may be integrated on a display side of the OLED display device. The color filter layer 2 may function as a filter, to cause the color of light emitted by the light emitting elements in the OLED display device to be purer. The black matrix 3 may prevent the light emitted by the adjacent light emitting elements from being mixed with each other. The touch panel is integrated on the OLED display device, so that the OLED display device may be used for touch control and improving the color purity of display.

The touch panel is structurally arranged, so that the optical filter and the touch panel may be integrated together. Compared with the prior art where the optical filter and the touch panel are directly integrated in the OLED display device, the insulating layer 43 made of the material same as that of the color filter layer 2 may replace the insulating layer which needs to be separately arranged in the touch panel in the prior art; the black matrix 3 may replace the first planarization layer which needs to be independently arranged in the touch panel in the prior art. In this way, the number of layers is reduced in a case where the optical filter and the touch panel are integrated together, the thickness of layers is reduced in a case where the optical filter and the touch panel are integrated together, and the bending performance of the touch panel is improved; meanwhile, in the touch panel in a case where the optical filter and the touch panel are integrated together in the implementation, as the insulating layer and the first planarization layer are not manufactured, the number of the manufacturing processes is reduced, and the production cost is reduced; in addition, the total thickness of the touch panel is reduced in a case where the optical filter and the touch panel are integrated together, when the touch panel is integrated on the OLED display device, the signal lines of the touch structures 4 in the touch panel may be routed to the binding region of the OLED display device through a small height difference; and the black matrix 3 has a certain leveling property, so that in the process of directly manufacturing the touch panel on the OLED display device, the black matrix 3 extending from a display region to the binding region of the OLED display device may form a relatively gentle slope. In this way, the signal lines of the touch structure 4 may be smoothly routed to the binding region of the OLED display device, thereby avoiding the phenomenon of open circuit or short circuit of the signal lines routing from the display region to the binding region is avoided, and ensuring the quality of the OLED display device.

In some embodiments, referring to FIG. 4, the plurality of first regions 101 include a plurality of first sub-regions 1011 and a plurality of second sub-regions 1012. Each first electrode 41 includes electrode bodies 411 and a bridge electrode 412 in a corresponding one of the plurality of first sub-regions 1011; openings are disposed in the black matrix 3; each bridge electrode 412 is disposed in an opening. In the embodiment as shown in FIG. 4, each bridge electrode 412 is disposed on a bottom of the opening and a slope of the opening. For example, each bridge electrode 412 is formed by metal wirings of a first metal layer M1. The insulating layer 43 and the electrode bodies 411 are sequentially stacked on a side of corresponding bridge electrode 412 away from the base 1; the bridge electrode 412 is connected to the two corresponding electrode bodies 411 arranged at the two opposite ends of the corresponding opening in the first direction; and the electrode bodies 411 and the corresponding second electrode 42 are disposed in a same layer and spaced apart from each other; and each second electrode 42 is provided in the corresponding second sub-region 1012. That is, in this embodiment, the electrode body 411 of the first electrode 41 and the corresponding second electrode 42 are located in a same layer, for example, may be formed in a second metal layer M2; the bridge electrode 412 of the first electrode 41 and the second electrode 42 are located in different layers; for example, the bridge electrode 412 may be formed in the first metal layer M1 and the second metal layer M2 is located on the first metal layer M1; and the insulating layer 43 is disposed between the bridge electrode 412 and the electrode body 411. That is, the insulating layer 43 is filled in the opening to cover the bridge electrode 412. As shown in FIG. 4, a dummy bridge electrode 416 is further provided in the second sub-region 1012 and is in the same layer as the bridge electrode 412; the dummy bridge electrode 416 is provided on a bottom of the opening in the second sub-region 1012 and is separated from the second electrode 42 by the insulating layer 43. For example, the plurality of second electrodes 42 may be connected together by using the wirings in the second metal layer M2 as connecting lines to form a mesh structure of a touch sensing electrode unit, and mesh structures of a plurality of touch sensing electrode units may be connected together by using the wirings on the second metal layer M2 as connecting lines to form mesh structures of a row of touch sensing electrode units; the electrode bodies of the plurality of first electrodes may be connected together by using the wirings on the second metal layer M2 as connecting lines to form a mesh structure of a touch driving electrode unit, and mesh structures of a plurality of touch driving electrode units may be connected together by using the wirings on the first metal layer M1 as connecting lines to form mesh structures of a column of touch driving electrode units; the mesh structures of the column of touch driving electrode units and the mesh structures of the row of touch sensing electrode units are separated from each other by the insulating layer, to form a mutual capacitance detection structure therebetween.

In some embodiments, the color filter layer 2 includes a red filter layer 21, a green filter layer 22, and a blue filter layer 23; the color filter layers 2 are arranged in an array with a column direction being the first direction Y and a row direction being the second direction X; the red filter layers 21, the green filter layers 22 and the blue filter layers 23 are alternately arranged in sequence along the first direction Y; the red filter layers 21, the green filter layers 22 and the blue filter layers 23 are alternately arranged in sequence along the second direction X; surfaces of the color filter layers 2, the insulating layers 43 and the black matrix 3 away from the base 1 are flush with each other. The color filter layer 2 is disposed corresponding to a pixel unit; the pixel units are arranged in an array, and the color filter layers 2 are also arranged in an array. That is, the second regions 102 are arranged in an array.

In some embodiments, a color of the insulating layer 43, on both sides of any color filter layer 2 and adjacent to this color filter layer 2 along both the first direction Y and the second direction X, is different from a color of this color filter layer 2. With such an arrangement, the light emitted from the light emitting element corresponding to the color filter layer 2 will not exit through the insulating layer 43 located on both sides of the color filter layer 2, which prevents the light emitted by two adjacent light emitting elements from being mixed with each other.

In some embodiments, the surfaces of the color filter layers 2, the black matrix 3, and the insulating layers 43 away from the base 1 are uneven rough surfaces. With such an arrangement, approximately parallel light emitted by the light emitting elements may be converted into diffuse scattering light after passing through the color filter layers 2, thereby improving the problem of large color shift when viewed from the front and side of the OLED display device.

In some embodiments, the touch panel further includes a protective layer 5 on a side of the touch structures 4 and the color filter layers 2 away from the base 1. The protective layer 5 is usually made of an organic resin material, and the protective layer 5 may well protect the touch structures 4 and the color filter layers 2 in the touch panel.

In some embodiments, the first electrode 41 and the second electrode 42 may be in the shape of a block or a mesh.

In some embodiments, the first electrodes 41 arranged along the first direction Y are connected as a whole and connected to one signal line; the second electrodes 42 arranged along the second direction X are connected as a whole and connected to one signal line.

If touch electrode units formed by the first electrodes 41 are driving electrode units and touch electrode units formed by the second electrodes 42 are sensing electrode units, in the touch panel during touch, driving voltage signals are input to the touch electrode units formed by the first electrodes 41 row by row along the second direction X and voltage signals output by second electrodes 42 along the first direction Y are received; a mutual capacitance touch is performed on the touch panel, and the touch principle is as follows: when a finger touches the touch panel, the coupling between the touch electrode unit formed by the first electrode 41 and the touch electrode unit formed by the second electrode 42 near the touch point is affected, thereby changing the capacitance between the touch electrode units; when the mutual capacitance is detected, driving voltage signals are sequentially input to the touch electrode units formed by the first electrodes 41, the touch electrode units formed by the second electrodes 42 receive the signals at the same time, and capacitance values at all the intersections of the first directions Y and the second directions X, that is, the capacitance of the whole touch panel in a two-dimensional plane, may be obtained. A coordinate of each touch point may be calculated according to the capacitance change data of the touch panel in the two-dimensional plane, thereby achieving the mutual capacitance touch on the touch panel.

In addition, in some embodiments, the base 1 is made of a release film. That is, the base 1 may be peeled off from the touch panel so as to attach the touch panel to the OLED display device. Certainly, the touch panel may also be directly manufactured on the display side of the OLED display device. In this case, the touch panel is directly manufactured on the display side of the encapsulated OLED display device without the base 1.

The release film used for the base 1 may be a PE release film, a PET release film, a PC release film, a PMMA release film, or the like. In this embodiment, the base 1, the black matrix 3, the color filter layers 2, the insulating layers 43, and the protective layer 5 are all made of organic film materials, so that the touch panel has good bending performance and is suitable for touch control of a flexible display panel.

Based on the above structure of the touch panel, an embodiment of the present disclosure further provides a method for manufacturing the touch panel, where the touch panel includes a base; the base includes a plurality of first regions and a plurality of second regions; the plurality of first regions include a plurality of first sub-regions and a plurality of second sub-regions; each second region is a grid region surrounded by the first regions; the method includes forming a color filter layer in the second region; further includes forming a black matrix and touch structures in the first region; the touch structures are partially located in the black matrix; forming a touch structure includes forming a first electrode, a second electrode, and an insulating layer in an opening in the black matrix; and the insulating layer is made of a material same as that of the color filter layer.

Figure 5:
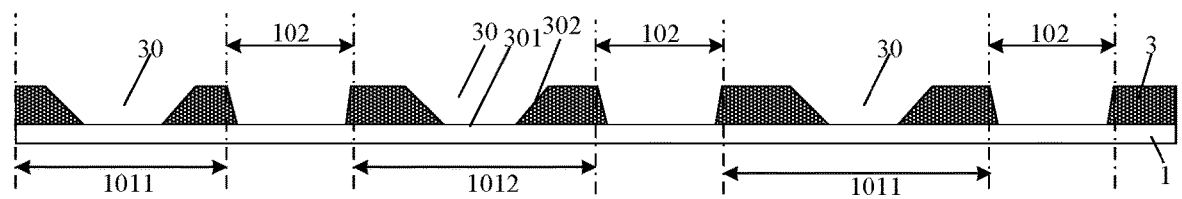
FIG. 5 is a cross-sectional view of a touch panel after the step S1 in the manufacturing method for the touch panel according to the embodiment of the present disclosure.

In some embodiments, forming the first electrode includes forming an electrode body and a bridge electrode; forming the color filter layer includes forming a red filter layer, a green filter layer and a blue filter layer; the manufacturing method of the touch panel specifically includes the following steps, as shown in FIGS. 5 to 9:

Step S1: forming a pattern of the black matrix 3 on the base 1 through one process, and forming openings 30 in the black matrix 3; the black matrix 3 is formed in the first region 101; each opening 30 includes a bottom 301 of the opening and slopes 302 of the opening; the plurality of first regions 101 include a plurality of first sub-regions 1011 and a plurality of second sub-regions 1012; as shown in FIG. 5.

In this step, a black matrix film is coated on the base 1, then the pattern of the black matrix 3 is formed through exposure and development, and patterns of openings 30 are formed in the black matrix 3; a pattern of a region for forming the color filter layer is formed while the black matrix 3 is patterned.

Figure 6:
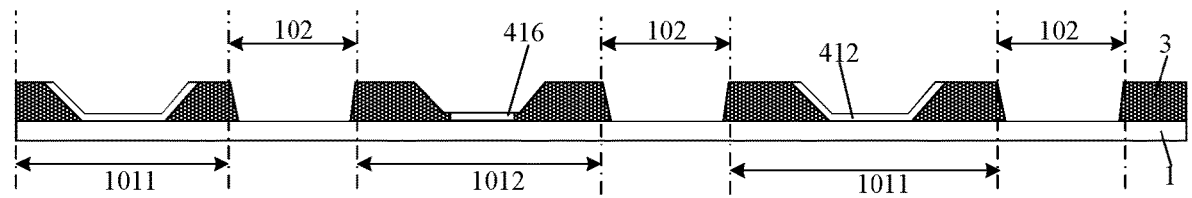
FIG. 6 is a cross-sectional view of a touch panel after the step S2 in the manufacturing method for the touch panel according to the embodiment of the present disclosure.

Step S2: forming patterns of the bridge electrodes 412; each bridge electrode 412 is located in the corresponding opening 30 of the corresponding first sub-region 1011 as shown in FIG. 6. Step S2 further includes forming a pattern of a dummy bridge electrode 416 located in the opening 30 of the second sub-region 1012. In the embodiment shown in FIG. 6, each bridge electrode 412 is formed on the bottom of the opening 30 and extends towards from the bottom to the slope (which may also be referred to as a sidewall) of the opening, and the dummy bridge electrode 416 is formed only on the bottom of the opening in this embodiment.

In this step, a conductive metal film is deposited, and patterns of the bridge electrodes 412 and the dummy bridge electrode 416 are formed through one patterning process (including exposure, development, etching, and the like); meanwhile, a pattern of signal lines (not shown in the drawings) connecting the first electrodes may also be formed. That is, connecting lines connecting the plurality of first electrodes to form the mesh structures of the touch electrode units may be formed at the same time. The bridge electrode 412, the dummy bridge electrode 416 and the signal line connecting the first electrodes may be formed by, for example, wirings in the first metal layer M1 in this step.

In the present disclosure, the second sub-region 1012 provided with the dummy bridge electrode 416 thereon is only provided with the second electrodes 42 in the signal lines forming the mesh structures of the touch electrode units, and thus the dummy bridge electrode 416 may not play any effective role but is only a byproduct for the manufacturing process. However, the dummy bridge electrode 416 may alternatively play an effective role in the first metal layer M1 to connect the bridge electrodes 412 of the plurality of first electrodes 41 to form the mesh structures of the touch electrode units. That is, the dummy bridge electrode 416 is used as a connecting line when the plurality of first electrodes 41 are connected together to form a mesh electrode of the touch structure.

Figure 7:
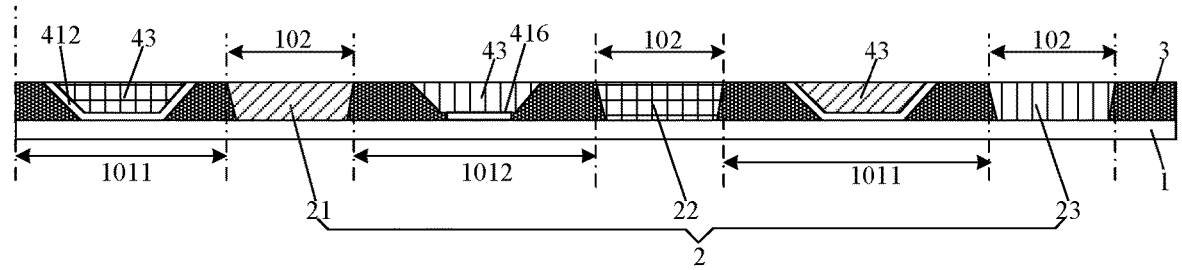
FIG. 7 is a cross-sectional view of a touch panel after the step S3 in the manufacturing method for the touch panel according to the embodiment of the present disclosure.

Step S3: sequentially forming the color filter layers 2 of different colors, and simultaneously, sequentially forming the insulating layers 43 of different colors; wherein, the color filter layer 2 is formed in the second region 102, and the insulating layers 43 is formed in the first region and covers the bridge electrode 412 in the first sub-region 1011 and the dummy bridge electrode 416 in the second sub-region 1012; the color filter layer 2 and the insulating layer 43 of the same color are formed through one process, as shown in FIG. 7. In this step, a great portion of the bridge electrode 412 is covered by the insulating layer, and only a portion of the bridge electrode 412 flush with an upper surface of the insulating layer 43 is exposed for electrical connection with the subsequently formed electrode bodies; in this embodiment, the dummy bridge electrode 416 is formed only on the bottom of the opening, so that the insulating layer 43 formed in the opening may completely cover the dummy bridge electrode 416.

In this step, firstly, a color filter film of one color, such as a red filter film, is coated; then, a pattern of the red filter layer 21 and a pattern of a portion of the insulating layer 43 made of a material of the red filter layer 21 are formed through processes of exposure and development. Similarly, a pattern of the green filter layer 22 and a pattern of a portion of the insulating layer 43 made of a material of the green filter layer, and a pattern of the blue filter layer 23 and a pattern of a portion of the insulating layer 43 made of a material of the blue filter layer, are formed.

Figure 8:
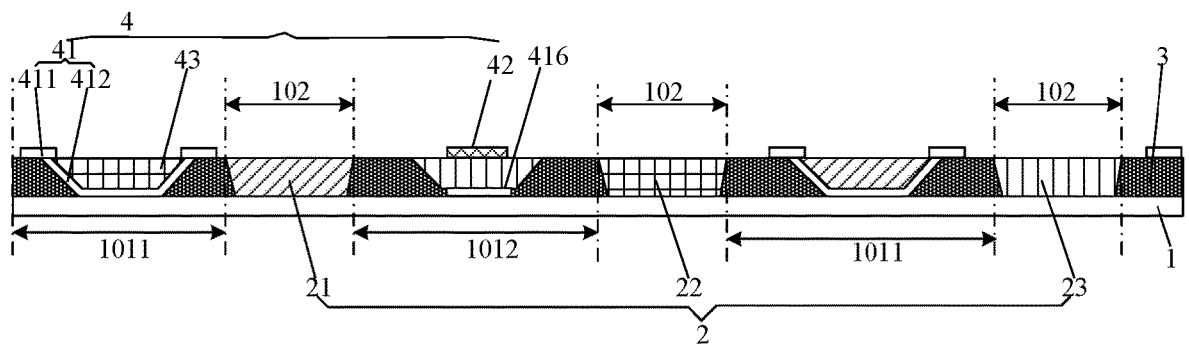
FIG. 8 is a cross-sectional view of a touch panel after the step S4 in the manufacturing method for the touch panel according to the embodiment of the present disclosure.

Step S4: forming patterns of the electrode bodies 411 and the second electrodes 42 through one process; the electrode body 411 is connected to the bridge electrode 412 as shown in FIG. 8.

In this step, a conductive metal film (the second metal layer M2) is deposited, and patterns of the electrode bodies 411 and the second electrodes 42 are formed through one patterning process (including the steps of exposure, development, etching, and the like); meanwhile, a pattern (not shown in the drawings) of signal lines connecting the second electrodes 42 may also be formed. That is, connection lines connecting the plurality of second electrodes to form the mesh structures of the touch electrode units may be formed at the same time. The patterns of the electrode bodies 411 and the second electrodes 42 may be formed by, for example, wirings in the second metal layer M2 in this step.

In addition, in step S4, when the patterns of the electrode body 411 and the second electrode 42 are formed by etching, a process of treating the surfaces of the color filter layers 2, the insulating layers 43, and the black matrix 3 may be added, so as to treat the surfaces of the color filter layers 2, the insulating layers 43, and the black matrix 3 away from the base 1 into uneven rough surfaces. The specific processes of treatment are as follows: introducing oxygen into a process chamber, and reacting the oxygen with the surfaces of the color filter layers 2, the insulating layers 43 and the black matrix 3 to form uneven surfaces; or bombarding the surfaces of the color filter layers 2, the insulating layers 43 and the black matrix 3 with inert gas in the process chamber, to form uneven surfaces; or, the above two treatment processes can be used simultaneously. The surfaces of the color filter layers 2, the insulating layers 43 and the black matrix 3 away from the base 1 are processed into uneven surfaces, so as to improve the OLED display device adopting the touch panel.

Figure 9:
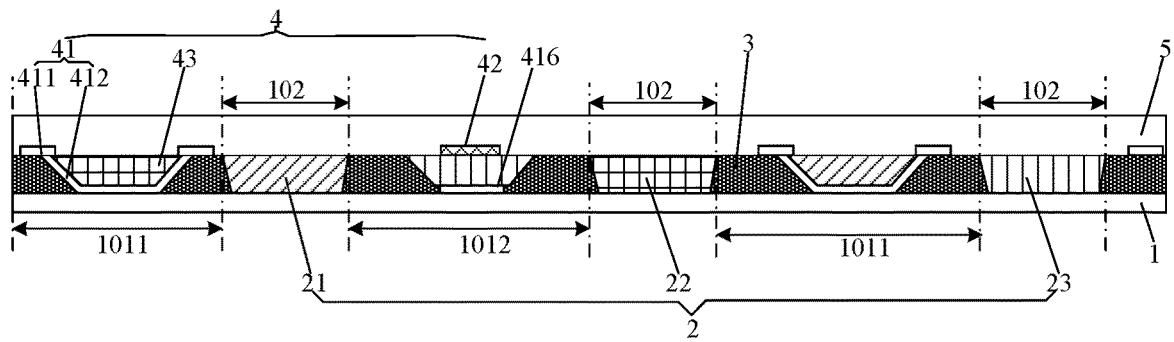
FIG. 9 is a cross-sectional view of a touch panel after the step S5 in the manufacturing method for the touch panel according to the embodiment of the present disclosure.

The method for manufacturing a touch panel further includes, after forming the patterns of the electrode body 411 and the second electrode 42:

Step S5, forming the protective layer 5, as shown in FIG. 9. The protective layer 5 is formed by coating.

By adopting the manufacturing method to manufacture the touch panel, compared with the prior art where the optical filter and the touch panel are directly integrated in the OLED display device, processes of manufacturing the insulating layer of silicon nitride and the first planarization layer are reduced, so that the production cost is reduced, and the thickness of the touch panel is reduced, and the bending performance of the touch panel is improved.

Figure 10:
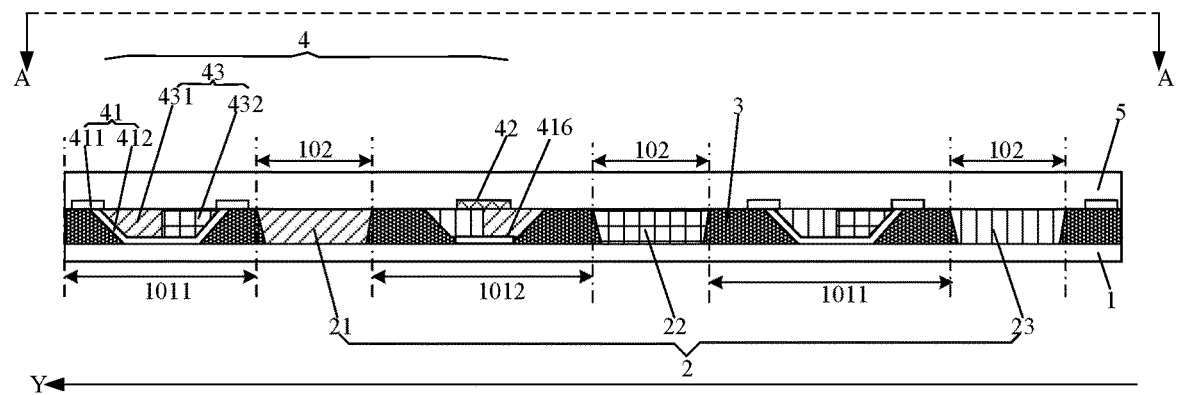
FIG. 10 is a cross-sectional view of the touch panel shown in FIG. 3 taken along a line AA.

A touch panel is provided in an embodiment of the present disclosure. Unlike the above-described embodiment, as shown in FIG. 10, the insulating layer 43 includes a first sub-portion 431 and a second sub-portion 432; and the first sub-portions 431 and the second sub-portions 432 are sequentially arranged along the first direction Y; and the first sub-portions 431 and the second sub-portions 432 are sequentially arranged along the second direction; the colors of materials of the color filter layers of the first sub-portion 431 and the second sub-portion 432 are different; and a color of the first sub-portion 431 and the second sub-portion 432, on both sides of any color filter layer 2 and adjacent to this color filter layer 2 along both the first direction Y and the second direction, is different from a color of this color filter layer 2.

With such an arrangement, the light emitted from the light emitting element corresponding to the color filter layer 2 will not exit through the insulating layer 43 located on both sides of the color filter layer 2, which prevents the light emitted by two adjacent light emitting elements from being mixed with each other.

Other structures of the touch panel in this embodiment are the same as those in the above embodiments, and are not described herein again.

Based on the structure of the touch panel in the embodiment of the present disclosure, the embodiment further provides a method for manufacturing the touch panel. Unlike the above-described method for manufacturing the touch panel, forming the insulating layer includes forming a first sub-portion and a second sub-portion of different colors; the manufacturing method of the touch panel specifically includes the following steps:

Step S1: forming the pattern of the black matrix through one process, and forming openings in the black matrix; the black matrix is formed in the first region. The plurality of first regions 101 include the plurality of first sub-regions 1011 and the plurality of second sub-regions 1012.

Step S2: forming patterns of the bridge electrodes and the dummy bridge electrodes; each bridge electrode 412 is formed in the corresponding opening of the corresponding first sub-region 1011; the dummy bridge electrode 416 is formed in the opening of the second sub-region 1012.

Step S3: sequentially forming color filter layers of different colors, and simultaneously, sequentially forming sub-portions of the insulating layers of different colors; that is, sequentially forming a first sub-portion and a second sub-portion of the insulating layers with different colors; wherein, the color filter layers are formed in the second region, and the sub-portions (i.e. the first sub-portion and the second sub-portion) of the insulating layers are formed in the first region; the color filter layers and the sub-portions (i.e., the first sub-portion and the second sub-portion) of the insulating layer of the same color are formed through one process.

Figure 16:
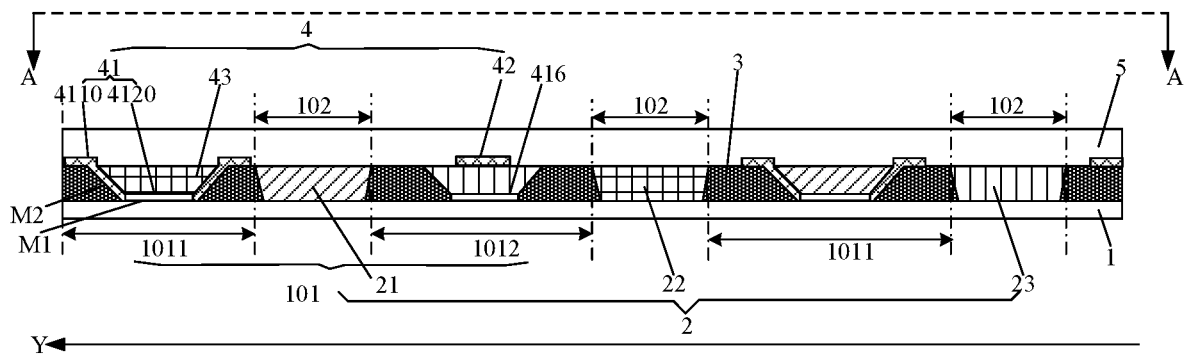
FIG. 16 is a schematic cross-sectional view of a structure of a touch panel according to an embodiment of the present disclosure.

Step S4: forming the patterns of the electrode body and the second electrode through one process; the electrode body is connected to the bridge electrode. Two electrode bodies 411 are formed at opposite edges of the opening of each first sub-region 1011, respectively, such that the two electrode bodies 411 are connected together by the bridge electrode 412 formed in the opening. The second electrode 42 is formed on the insulating layer 43 in the second sub-region 1012. In the present disclosure, specific shapes of the bridge electrode 412 and the electrode bodies 411 in the first sub-region 1011 are not limited. For example, as shown in FIG. 16, the electrode bodies 411 may be two discrete electrode bodies 411 formed at two opposite ends of the opening along the first direction Y, and an orthographic projection of each electrode body 411 on the base may be rectangular. However, alternatively, the orthographic projection of each electrode body 411 on the base may be circular, oval, or the like, as long as the selected shape does not affect the connection of the subsequently formed first electrodes and the connection of the second electrodes to form the touch electrode units.

The specific processes of the steps and other steps in the manufacturing method for the touch panel in the embodiment are the same as those in the above embodiment, and are not described again here.

Figure 11:
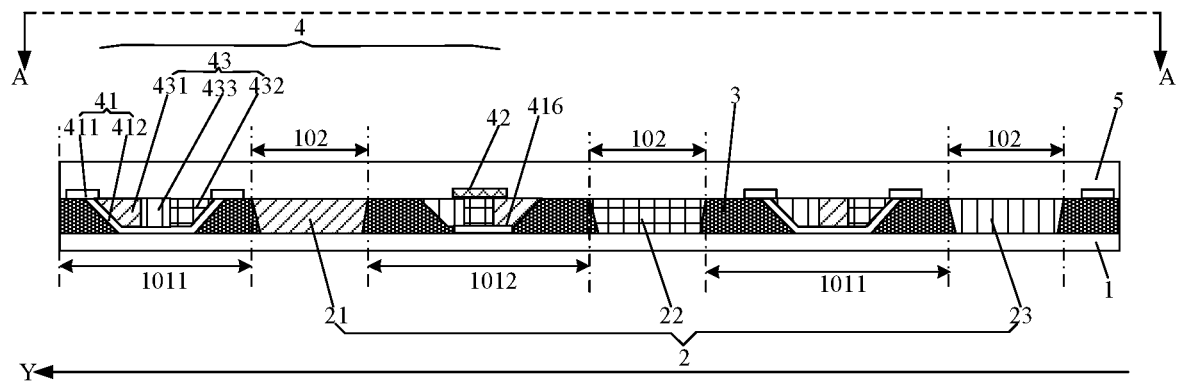
FIG. 11 is a cross-sectional view of the touch panel shown in FIG. 3 taken along a line AA.

A touch panel is provided in an embodiment of the present disclosure. Unlike the above-described embodiment, as shown in FIG. 11, the insulating layer 43 includes a first sub-portion 431, a second sub-portion 432, and a third sub-portion 433; and the second sub-portion 432, the third sub-portion 433 and the first sub-portion 431 are sequentially arranged along the first direction Y; and the first sub-portion 431, the second sub-portion 432 and the third sub-portion 433 are sequentially arranged along the second direction X; the colors of materials of the color filter layers of the first sub-portion 431, the second sub-portion 432 and the third sub-portion 433 are different; and a color of the first sub-portion 431, the second sub-portion 432 and the third sub-portion 433, on both sides of any color filter layer 2 and adjacent to this color filter layer 2 along both the first direction Y and the second direction X, is different from a color of this color filter layer 2.

With such an arrangement, the light emitted from the light emitting element corresponding to the color filter layer 2 will not exit through the insulating layer 43 located on both sides of the color filter layer 2, which prevents the light emitted by two adjacent light emitting elements from being mixed with each other.

Other structures of the touch panel in this embodiment are the same as those in the above embodiments, and are not described herein again.

Based on the structure of the touch panel in the embodiment of the present disclosure, the embodiment further provides a method for manufacturing the touch panel. Unlike the above-described method for manufacturing the touch panel, forming the insulating layer includes forming the first sub-portion, the second sub-portion and the third sub-portion of different colors; in the method for manufacturing the touch panel, step S3 specifically includes: sequentially forming color filter layers of different colors, and simultaneously, sequentially forming sub-portions of the insulating layers of different colors; that is, sequentially forming the first sub-portion, the second sub-portion and the third sub-portion of the insulating layers of different colors; wherein, the color filter layers are formed in the second region, and the sub-portions (i.e. the first sub-portion, the second sub-portion and the third sub-portion) of the insulating layer are formed in the first region; the color filter layers and the sub-portions (i.e., the first sub-portion, the second sub-portion, and the third sub-portion) of the insulating layer of the same color are formed through one process.

The specific processes of the steps and other steps in the manufacturing method for the touch panel in this embodiment are the same as those in the above embodiment, and are not described again here.

Figure 12:
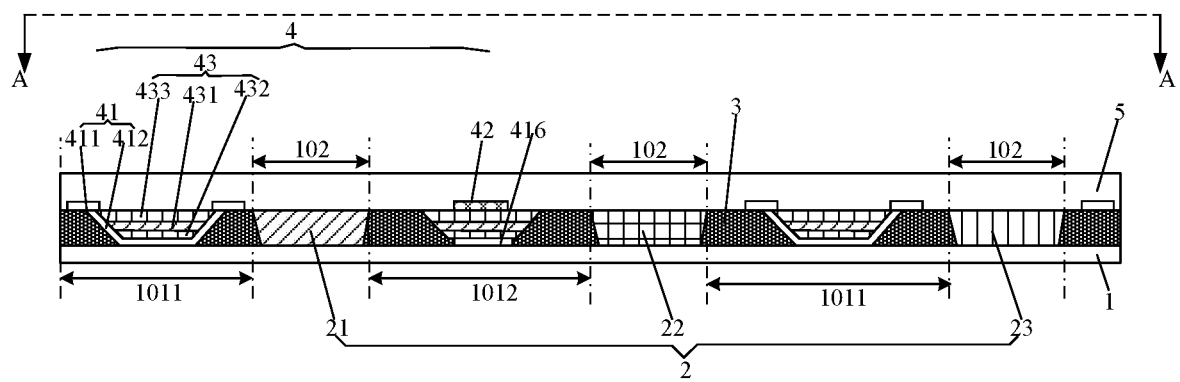
FIG. 12 is a cross-sectional view of the touch panel shown in FIG. 3 taken along a line AA.

An embodiment of the present disclosure further provides a touch panel. Unlike the above embodiment, as shown in FIG. 12, the insulating layer 43 includes a first sub-portion 431, a second sub-portion 432, and a third sub-portion 433; and the second sub-portion 432, the first sub-portion 431, and the third sub-portion 433 are sequentially stacked in a direction away from the base 1; the materials of color filter layers of the first, second and third sub-portions 431, 432 and 433 have different colors.

With such an arrangement, the light emitted from the light emitting element corresponding to the color filter layer 2 will not exit through the insulating layer 43 located on both sides of the color filter layer 2, which prevents the light emitted by two adjacent light emitting elements from being mixed with each other.

Other structures of the touch panel in this embodiment are the same as those in the above embodiments, and are not described herein again.

Based on the structure of the touch panel in the embodiment of the present disclosure, the embodiment further provides a method for manufacturing the touch panel. Unlike the above-described method for manufacturing the touch panel, the specific manufacturing process of step S3 is: firstly, coating a color filter film of one color, such as a red filter film; then, a pattern of the red filter layer and a pattern of the first sub-portion of the insulating layer made of a material of the red filter layer are formed through an exposure process using a gray mask and a development process. Similarly, a pattern of the green filter layer and a pattern of the second sub-portion of the insulating layer made of a material of the green filter layer, and a pattern of the blue filter layer and a pattern of the third sub-portion of the insulating layer made of a material of the blue filter layer, are formed through an exposure process using a gray mask and a development process.

It should be noted that, the colors of the first sub-portion, the second sub-portion and the third sub-portion may be in the order of the red, green and blue, but in the order of the green, red and blue, or in the order of the blue, red and green setting, etc., and no matter how the colors of the first sub-portion, the second sub-portion and the third sub-portion are set, the light emitted from the light emitting element corresponding to the color filter layer will not exit through the insulating layer located on both sides of the color filter layer, which prevents the light emitted by two adjacent light emitting elements from being mixed with each other.

Other steps and the specific processes thereof in the manufacturing method for the touch panel in this embodiment are the same as those in the above embodiment, and are not described again here.

In the touch panel provided in the above-mentioned disclosed embodiment, the optical filter and the touch panel may be integrated together. Compared with the prior art where the optical filter and the touch panel are directly integrated in the OLED display device, the insulating layer made of the material same as that of the color filter layer may replace the insulating layer which needs to be separately arranged in the touch panel in the prior art; the black matrix may replace the first planarization layer which needs to be independently arranged in the touch panel in the prior art. In this way, the number of layers is reduced in a case where the optical filter and the touch panel are integrated together, the thickness of layers is reduced in a case where the optical filter and the touch panel are integrated together, and the bending performance of the touch panel is improved; meanwhile, in the touch panel in a case where the optical filter and the touch panel are integrated together in the implementation, as the insulating layer and the first planarization layer are not manufactured, the number of the manufacturing processes is reduced, and the production cost is reduced; in addition, the total thickness of the touch panel is reduced in a case where the optical filter and the touch panel are integrated together, when the touch panel is integrated on the OLED display device, the signal lines of the touch structures in the touch panel may be routed to the binding region of the OLED display device through a small height difference; and the black matrix has a certain leveling property, so that in the process of directly manufacturing the touch panel on the OLED display device, the black matrix extending from a display region to the binding region of the OLED display device may form a relatively gentle slope. In this way, the signal lines of the touch structure may be smoothly routed to the binding region of the OLED display device, thereby avoiding the phenomenon of open circuit or short circuit of the signal lines routing from the display region to the binding region, and ensuring the quality of the OLED display device.

Figure 13:
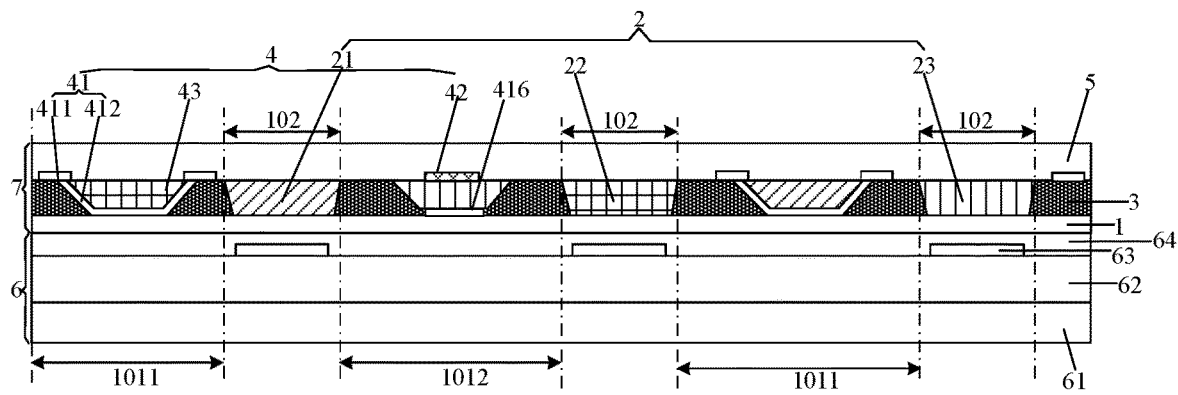
FIG. 13 is a cross-sectional view of a display panel according to an embodiment of the present disclosure.

In a second aspect, an embodiment of the present disclosure provides a display panel, as shown in FIG. 13, which includes a display substrate 6; the display substrate 6 includes a pixel definition region and a pixel region defined by the pixel definition region; and the display panel further includes the touch panel 7 in any one of the above embodiments; the touch panel 7 is disposed on a display side of the display substrate 6; the first region of the touch panel 7 corresponds to the pixel definition region, and the second region of the touch panel 7 corresponds to the pixel region.

The pixel definition region is a region for separating the pixel regions from each other; and the pixel definition layer and some circuit traces are generally arranged in the pixel definition region.

Compared with the prior art where the optical filter and the touch panel are directly integrated in the OLED display device, by having the touch panel 7 in any one of the embodiments on the display substrate 6, the thickness of the display panel is reduced, and the bending performance of the display panel is improved; the production cost of the display panel is reduced; in addition, the total thickness of the touch panel 7 is reduced, when the touch panel 7 is integrated on the display substrate 6, the signal lines of the touch structures in the touch panel 7 may be routed to the binding region of the display substrate 6 through a small height difference; and the black matrix has a certain leveling property, so that in the process of directly manufacturing the touch panel 7 on the OLED display device, the black matrix extending from a display region to the binding region of the display substrate 6 may form a relatively gentle slope. In this way, the signal lines of the touch structure may be smoothly routed to the binding region of the display substrate 6, thereby avoiding the phenomenon of open circuit or short circuit of the signal lines routing from the display region to the binding region, and ensuring the quality of the OLED display device.

In some embodiments, the display substrate 6 includes the base 61, and the pixel driving circuit 62 and light emitting elements 63 sequentially disposed on the base 61; the light emitting elements 63 are located in the pixel region, and the pixel driving circuit 62 is connected to the light emitting elements 63 to drive the light emitting elements 63 to emit light.

The light emitting element 63 may be an OLED (Organic Light Emitting Diode) or an LED (Light Emitting Diode). The pixel driving circuit 62 adopts a conventional, mature pixel circuit design without any modification in this embodiment, and is not described herein again.

In some embodiments, the light emitting element 63 emits light of the same color as the color of the color filter layer 2 in the second region corresponding to the light emitting element 63. That is, the light emitting element 63 includes a red light emitting element, a green light emitting element, and a blue light emitting element. The color filter layer 2 may make the color of light emitted by the light emitting element 63 purer, thereby improving the display color effect of the display panel.

It should be noted that, the light emitting element may be a blue organic light emitting diode. At this time, the color filter layer achieves a color display of the display panel.

In some embodiments, the display substrate 6 further includes the encapsulation layer 64 on a side of the light emitting elements 63 away from the base 61, for encapsulating the light emitting elements 63.

The encapsulation layer 64 is formed by alternately stacking a plurality of organic layers and a plurality of inorganic layers, so that the light emitting elements 63 may be prevented from being damaged by external water and oxygen.

It should be noted that the base 1 of the touch panel 7 may be directly disposed on the encapsulation layer 64, or the remaining portions of the touch panel 7 with the base 1 been peeled off may be disposed on the encapsulation layer 64.

In addition, it should be noted that the display substrate may not be provided with the encapsulation layer, and the base of the touch panel may be used as the encapsulation layer of the display substrate, for encapsulating the light emitting element.

Based on the display panel provided by the embodiment of the present disclosure, the embodiment further provides a manufacturing method of the display panel, which includes manufacturing a display substrate, wherein the display substrate includes the pixel definition region and the pixel region defined by the pixel definition region; and the manufacturing method of the display panel further includes manufacturing the touch panel in any one of the embodiments on the display side of the display substrate; the first region of the touch panel corresponds to the pixel definition region, and the second region of the touch panel corresponds to the pixel region.

In some embodiments, manufacturing the display substrate includes sequentially forming the pixel driving circuit and the light emitting elements on the base substrate, and then forming the encapsulation layer for encapsulating the light emitting elements. The pixel driving circuit and the light emitting elements are formed through conventional processes, which are not described herein.

In some embodiments, the touch panel is formed on the encapsulation layer of the display substrate. The encapsulation layer may act as the base of the touch panel, and the black matrix, the color filter layers and the touch structures may be directly manufactured on the encapsulation layer. In some embodiments, the base of the touch panel, the black matrix, the color filter layers and the touch structures may also be formed on the encapsulation layer.

It should be noted that in some embodiments, the touch panel manufactured by the manufacturing method in the above embodiments may also be attached to the display side of the display substrate; the base of the touch panel may be peeled off, and the touch panel is then attached to the display side of the display substrate.

In addition, it should be noted that the display substrate in the display panel may also be a liquid crystal display substrate; and other structural arrangements of the liquid crystal display substrate are conventional structures capable of realizing normal display. For example, the liquid crystal display substrate includes a back plate for providing a backlight source and an array substrate; the touch panel and the array substrate are aligned and assembled; and liquid crystals are filled in a gap between the aligned and assembled touch panel and array substrate; in addition, an upper polarizer and a lower polarizer are respectively attached to the light incident side of the array substrate and the light outgoing side of the touch panel, and other structures of the liquid crystal display panel are not described herein again. The touch panel may not only realize touch control of the liquid crystal display panel, but also realize color display of the liquid crystal display panel.

According to the display panel provided by the embodiment of the present disclosure, by having the touch panel in any one of the embodiments, compared with the prior art where the optical filter and the touch panel are directly integrated in the OLED display device, the thickness of the display panel is reduced, and the bending performance of the display panel is improved; the production cost of the display panel is reduced; in addition, the total thickness of the touch panel is reduced, when the touch panel is integrated on the display substrate, the signal lines of the touch structures in the touch panel may be routed to the binding region of the display substrate through a small height difference; and the black matrix has a certain leveling property, so that in the process of directly manufacturing the touch panel on the OLED display device, the black matrix extending from a display region to the binding region of the display substrate may form a relatively gentle slope. In this way, the signal lines of the touch structure may be smoothly routed to the binding region of the display substrate, thereby avoiding the phenomenon of open circuit or short circuit of the signal lines routing from the display region to the binding region, and ensuring the quality of the OLED display device.

The display panel provided by the embodiment of the present disclosure may be any product or component with a display function, such as an OLED panel, an OLED television, an LED panel, an LED television, an LCD panel, an LCD television, a display, a mobile phone, and a navigator.

In the present disclosure, a material of the color filter layer 2 is used as the material of the insulating layer for forming patterns of the first electrodes (e.g., the touch driving electrodes Tx) and the second electrodes (e.g., the touch sensing electrodes Rx) required for touch detection in the mutual capacitance type touch panel. As described above, the insulating layer 43 may be a material of a color filter of a single color, or may be provided as a combination of materials of color filters of a plurality of colors as needed. In the touch panel integrated with the display function, the insulating layer 43 as the material of the color filter layer 2 of the optical filter is used, and thus, it is unnecessary to additionally provide the insulating layer 43, which reduces the complexity of the manufacturing process, thereby reducing the production cost; in addition, the overall thickness of the touch panel can be reduced.

Figure 14:
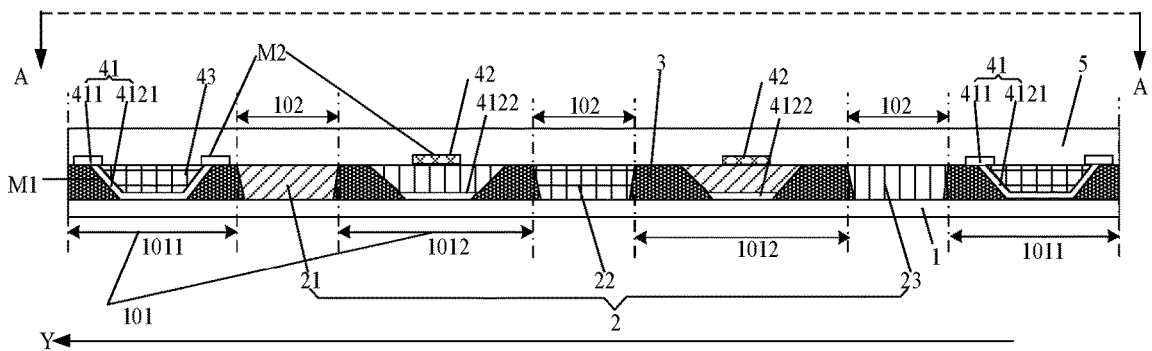
FIG. 14 is a schematic cross-sectional view of a structure of a touch panel according to an embodiment of the present disclosure.

FIG. 14 shows a cross-sectional view of a touch panel according to an embodiment of the present disclosure. As shown in FIG. 14, a touch structure of the touch panel of the present disclosure is implemented by the first metal layer M1 and the second metal layer M2 located above the first metal layer M1. The second metal layer M2 is used to form the patterns of the second electrodes 42 and patterns of the electrode bodies 411 in the first electrodes 41, and the first metal layer M1 positioned below the second metal layer M2 is used to form patterns of the bridge electrodes 412. In each first electrode 41, the bridge electrode 1011 in the first metal layer M1 is used to connect the electrode bodies 411 at two opposite ends in the second metal layer M2 in the first direction Y.

In FIG. 14, the touch panel integrated with the display function is divided into the plurality of first regions 101 and the plurality of second regions 102. In the embodiment shown in FIG. 14, the first electrodes 41 and the second electrodes 42 of the touch structure are disposed in the plurality of first regions 101; the color filter layer 2 is disposed in the plurality of second regions 102. The plurality of first regions 101 includes the plurality of first sub-regions 1011 and the plurality of second sub-regions 1012; the first electrodes 41 are disposed in the plurality of first sub-regions 1011, each first electrode includes two electrode bodies 411 in the second metal layer M2 and the bridge electrode 4121 in the first metal layer M1 connecting the two electrode bodies 411 together; the dummy bridge electrode 4122 in the second metal layer M2 and the second electrode 42 in the first metal layer M1 are disposed in each of the plurality of second sub-regions 1012. Based on this, it can be seen that in the embodiment shown in FIG. 14, the patterns of the first electrodes 41 for forming the touch driving electrodes Tx are disposed in the plurality of first sub-regions 1011, and the patterns of the second electrodes 42 for forming the touch sensing electrodes Rx are disposed in the plurality of second sub-regions 1012. That is, only the patterns for forming the first electrodes 41 are provided in the plurality of first sub-regions 1011, and the dummy bridge electrode 4122 in each of the plurality of second sub-regions 1012 is only embedded in the insulating layer 43, and does not have a bridging function as the bridge electrode 4121 in the first sub-region 1011 for connecting the electrode bodies 411 at two opposite ends in the first direction Y, but is merely an accessory product when forming the second metal layer M2. In nature, only the patterns of the second electrodes 42 for forming the touch sensing electrodes Rx are disposed in the second sub-regions 1012.

That is, in the touch panel of the embodiment of the present disclosure, the plurality of openings formed in the black matrix 3 disposed on the base are divided into the plurality of first sub-regions 1011, the plurality of second sub-regions 1012, and the second regions 102 in which the color filter layer (including, for example, a red filter, a green filter, and a blue filter) is disposed. The patterns of the first electrodes 41 are provided in the first sub-regions 1011, the patterns of the second electrodes 42 are provided in the second sub-regions 1012, and the color filter layer is provided in the second regions 102. That is, the plurality of first electrodes 41, the plurality of second electrodes 42, and the plurality of optical filters are alternately disposed on the base, so that the touch panel having the display function and the touch function is realized.

In the embodiment shown in FIG. 14, the dummy bridge electrode 4122 in the second sub-region 1012 is disposed only on the bottom of the opening formed in the black matrix 3. Unlike in FIG. 14, in the embodiment shown in FIG. 15, the dummy bridge electrode 4123 in the second sub-region 1012 is continuously disposed on the bottom and a part of an inclined surface (slope) of the opening formed in the black matrix, that is, the dummy bridge electrode 4123 continuously formed on the bottom and a part of the inclined surface is completely covered by the insulating layer 43. Thus, the dummy bridge electrode 4123 as shown in FIG. 15 cannot function as the bridge electrode.

FIG. 16 shows a schematic cross-sectional view of a structure of a touch panel according to an embodiment of the present disclosure. Unlike in FIG. 4, in the embodiment shown in FIG. 16, each first electrode 41 includes the bridge electrode 4120 and the electrode bodies 4110 arranged in the first sub-region 1011, wherein the bridge electrode 4120 is formed in the first metal layer M1 through a patterning process, and the electrode bodies 4110 are formed in the second metal layer M2 through a patterning process. As can be seen from FIG. 16, one part of the electrode body 4110 is formed on the slope of the opening, and the other part of the electrode body 4110 is formed at an edge of the opening. That is, in the method for manufacturing a display panel in this embodiment, the bridge electrode 4120 is firstly formed on the bottom of the opening through a patterning process in the first metal layer M1, and then the electrode body 4110 is formed in the second metal layer M2 through a patterning process or through an evaporation process by means of a mask layer, so that the electrode body 4110 includes a portion on the slope of the opening of the black matrix and a portion on an upper surface of the black matrix.

Figure 15:
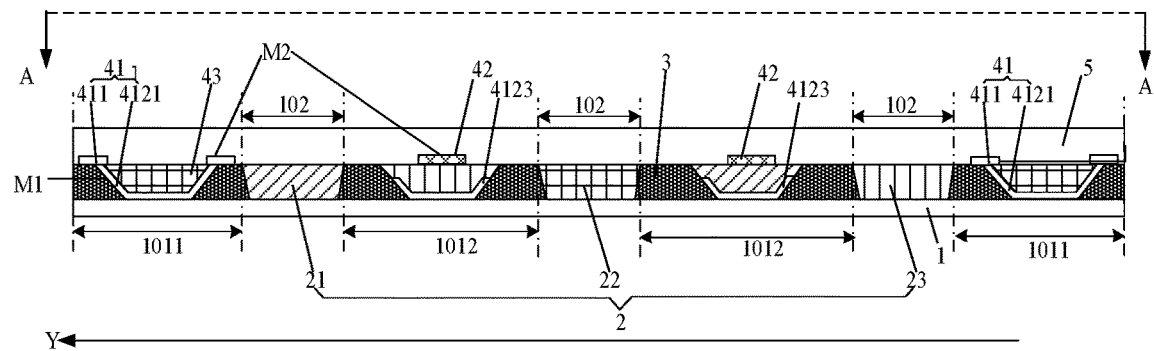
FIG. 15 is a schematic cross-sectional view of a structure of a touch panel according to an embodiment of the present disclosure.

FIGS. 14 to 16 show examples of the arrangement of the touch electrodes in the touch panel according to the embodiment of the present disclosure. For example, a plurality of touch electrodes and a plurality of optical filters may be disposed on the base in the manner shown in FIG. 17. In the embodiment shown in FIG. 17, the plurality of touch electrodes and the plurality of optical filters are alternately arranged on the base in the first direction Y (column direction) and the second direction X (row direction).

Figure 17:
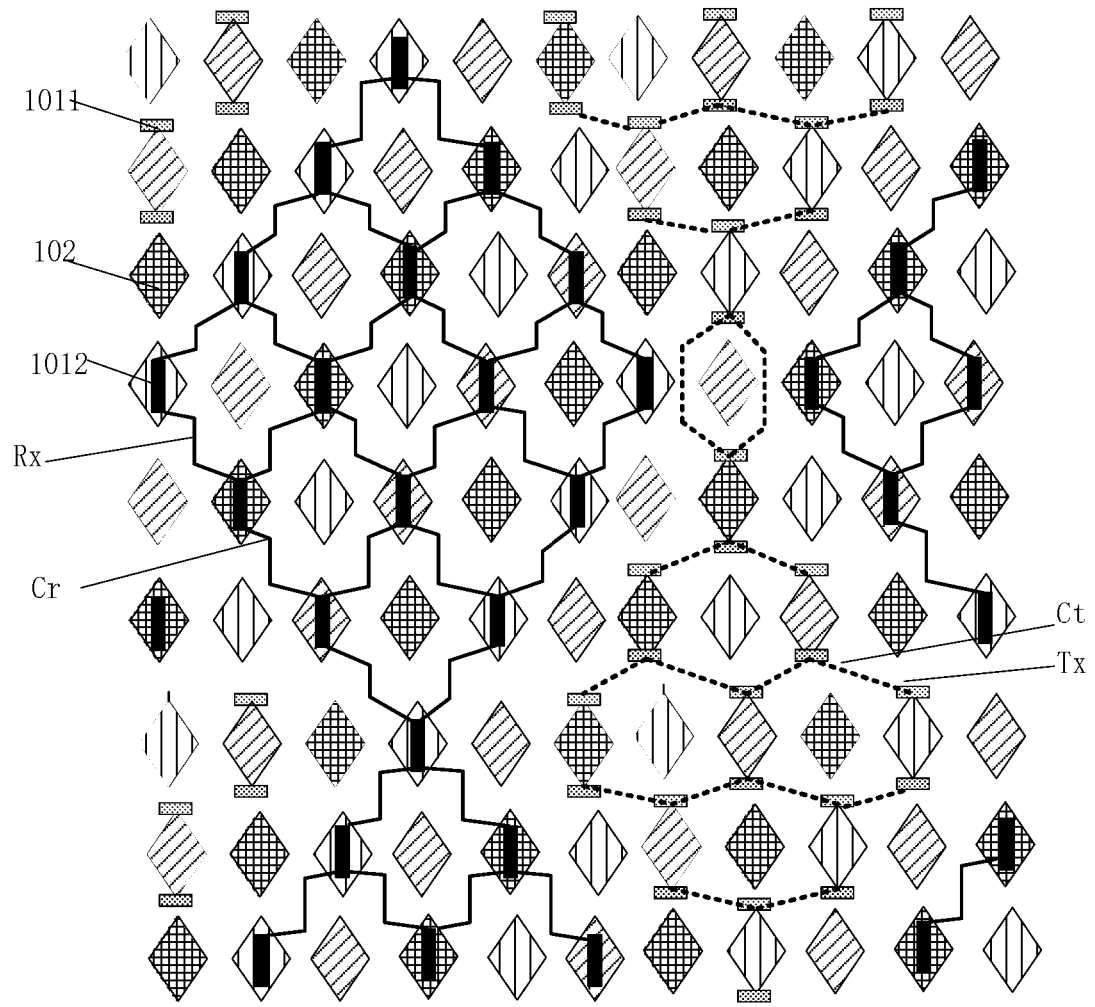
FIG. 17 is a schematic plan view of a structure of a touch panel according to an embodiment of the present disclosure.

For the mutual capacitance type touch structure, the mesh electrode structure shown in FIG. 17 needs to be implemented in a macroscopic view. Specifically, the first electrodes 41 as, for example, the touch driving electrode Tx constitute mesh electrodes extending in the column direction (i.e., the first direction Y) of the array; the second electrodes 42 as, for example, the touch sensing electrode RX constitute mesh electrodes extending in the row direction (i.e., the second direction X) of the array; the mesh electrodes from the first electrodes 41 and the mesh electrodes from the second electrodes 42 are separated from each other and insulated from each other; and the mesh electrodes from the first electrode 41 and the mesh electrodes from the second electrodes 42 are separated from each other to be insulated from each other by the insulating layer 43 and the black matrix 3 at bridging positions where the mesh electrodes cross each other.

Specifically, in the macroscopic mesh structure of the touch structure of the present disclosure, the touch driving electrode Tx or the touch sensing electrode Rx is microscopically enlarged as a metal mesh surrounding the optical filter of each pixel. That is, the optical filters of the pixels (that is, the red filter, the green filter, and the blue filter) are formed in the second region 102, and the metal wirings of the metal mesh structure of the first electrode 41 and the metal mesh structure of the second electrode 42 forming the touch structure between the pixels are respectively the mesh structures formed by appropriately connecting and cutting the first electrodes 41 and the second electrodes 42 respectively formed in the first sub-region 1011 and the second sub-region 1012 at specific positions, as shown in FIGS. 18 and 19.

Figure 18:
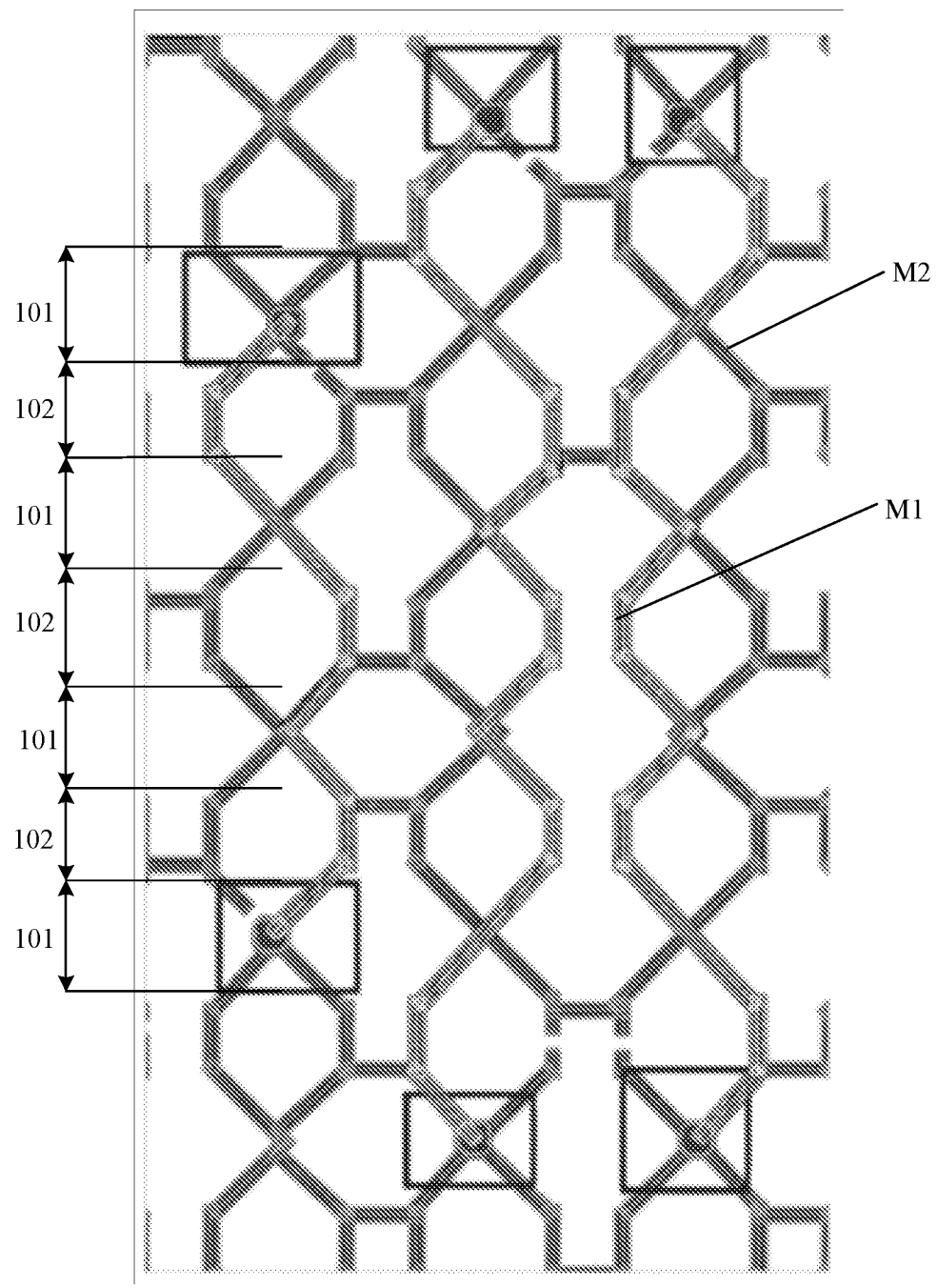
FIG. 18 is a schematic diagram illustrating how to connect touch electrodes of a touch panel according to an embodiment of the present disclosure.
Figure 19:
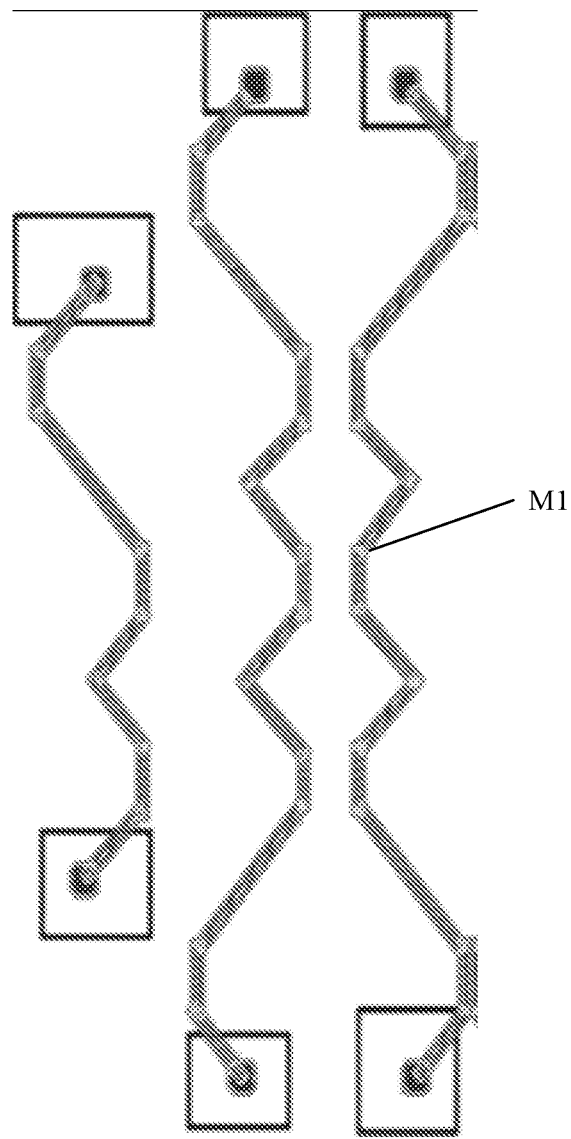
FIG. 19 is a schematic diagram illustrating how to connect touch electrodes of a touch panel according to an embodiment of the present disclosure.

FIG. 18 is a schematic diagram of a mesh structure of a pixel structure according to an embodiment of the present disclosure. FIGS. 14 to 16 may be cross-sectional views cut along a BB' direction shown in FIG. 18, for example. As shown in FIG. 18, the touch structure of the embodiment of the present disclosure includes a metal mesh pattern of the first electrode (such as the touch driving electrode Tx), and a metal mesh pattern of the second electrode (such as the touch sensing electrode Rx) formed in the second metal layer M2, and the bridging between the touch driving electrodes Tx is implemented by the first metal layer M1. The metal mesh pattern of the touch driving electrode Tx and the metal mesh pattern of the touch sensing electrode Rx formed in the second metal layer M2 are disposed (connected to each other and disconnected from each other) around the optical filter of the pixel, to form a touch metal pattern of a desired size. The specific cutting manner is not particularly limited in the present disclosure.

Examples shown in FIGS. 14 to 17 may be obtained by cutting the metal mesh pattern along the line BB' in FIG. 18, that is, two second sub-regions 1012 not including the bridge electrode 4121 and three second regions 102 (provided with color filters for realizing the display function) are provided between the two first sub-regions 1011: the first sub-region 1011 (provided with the first electrode 41 including the bridge electrode 4121 and two electrode bodies 411 arranged at both ends of the bridge electrode along the first direction Y, the bridge electrode 4121 is connected to the two electrode bodies 411 at both ends of the bridge electrode 4121, respectively, and the insulating layer 43 is made of for example the green filter), the second region 102 (for example, the red filter), the second sub-region 1012 (provided with the second electrode 42 which may or may not include the dummy bridge electrode; the insulating layer (for example, the same insulating layer as the blue filter material) between the second electrode 42 and the dummy bridge electrode is included with the dummy bridge electrode), the second region 102 (for example, the green filter), the second sub-region 1012 (provided with the second electrode 42 which may or may not include the dummy bridge electrode; the insulating layer (for example, the same insulating layer as the red filter material) between the second electrode 42 and the dummy bridge electrode is included with the dummy bridge electrode), the second region 102 (for example, the blue filter) and the first sub-region 1011 (provided with the first electrode 41 including the bridge electrode 4121 and two electrode bodies 411 disposed at two ends of the bridge electrode along the first direction Y, the bridge electrode 4121 is respectively connected to the two electrode bodies 411 at two ends of the bridge electrode, and the insulating layer 43 is made of a material such as the green filter).

However, the structure of the touch electrode of the present disclosure is not limited to the configuration described above, and may alternatively be a structure taken along a line CC' in FIG. 18, including a first sub-region 1011, a second region 102, a second sub-region 1012, a second region 102, a second sub-region 1012, a second region 102, a second sub-region 1012, a second region 102, a second sub-region 1012, a second region 102, and a first sub-region 1011 extending along the first direction Y. That is, five second regions 102 (color filter regions) and four second sub-regions 1012 are provided between the two first sub-regions 1011.

In addition, in order to obtain the required mesh structure, the two first sub-regions 1011 need to be connected. For example, the connection between the two first electrodes 41 in the two first sub-regions 1011 may be formed by means of the first metal layer M1 through a patterning process, and bridging lines (the connecting lines in the first metal layer M1 shown in FIG. 19) will be disposed to avoid the second regions for disposing the optical filters therein.

For example, as shown in FIG. 17, a plurality of first connecting lines Cr are disposed in the second metal layer M2 and configured to connect the plurality of second electrodes 42 into the mesh structure of the touch sensing electrode Rx; and a plurality of second connecting lines Ct are disposed in the second metal layer M2 and configured to connect the plurality of electrode bodies 411 together and to connect the bridge electrodes 4121 each connecting two opposite electrode bodies 411, to form the mesh pattern of the touch driving electrode Tx. In this embodiment, the plurality of first connecting lines Cr and the plurality of second connecting lines Ct avoid the polarizers of the pixel and are disposed in the first metal layer M1. The manner of providing the color filter layer including the optical filters of different colors on the base and the manner of connecting the first electrodes 41 in the plurality of first regions 101 to form the mesh structure of the touch sensing electrode Rx (such as where to connect, where to disconnect, whether a diamond-shaped or rectangular mesh structure is formed) are not particularly limited in the present disclosure.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A touch panel, comprising a base, wherein
   a black matrix is arranged on the base, and a plurality of openings are arranged in the black matrix and spaced from each other;
   the touch panel is divided into a plurality of first regions and a plurality of second regions, a portion of a touch structure is arranged in a first part of the plurality of openings and in the plurality of first regions; color filter layers are arranged in a second part of the plurality of openings and in the plurality of second regions, respectively;
   the plurality of first regions comprise a plurality of first sub-regions and a plurality of second sub-regions, a plurality of first electrodes for forming the touch structure are arranged in the plurality of first sub-regions, and a plurality of second electrodes for forming the touch structure are arranged in the plurality of second sub-regions;
   each first electrode comprises two electrode bodies and a bridge electrode connecting the two electrode bodies together; and
   an insulating layer is arranged in the first part of the openings and is made of a material of the color filter layers.

2. The touch panel of claim 1, further comprising a first metal layer and a second metal layer on the first metal layer;
   wherein the bridge electrode is on a bottom of a corresponding opening in the first metal layer; and
   the two electrode bodies are in the second metal layer.

3. The touch panel of claim 2, wherein the two electrode bodies are arranged at both edge ends of the opening along a first direction, and the bridge electrode extends along the first direction to connect the two electrode bodies together.

4. The touch panel of claim 3, wherein the bridge electrode is configured such that both ends of the bridge electrode extend upwards from the bottom of the corresponding opening respectively onto two slopes of the corresponding opening along the first direction, to be connected to the two electrode bodies respectively.

5. The touch panel of claim 3, wherein the two electrode bodies extend downwards onto two slopes of the corresponding opening along the first direction, to be connected to two ends of the bridge electrode on the bottom of the corresponding opening, respectively.

6. The touch panel of claim 3, wherein
   the electrode bodies and the second electrode are in a same layer.

7. The touch panel of claim 6, wherein
   a dummy bridge electrode is arranged in the first metal layer and on the bottom of a corresponding opening in each of the plurality of second sub-regions;
   an insulating layer made of the material of the color filter layers is arranged on the dummy bridge electrode and in the second sub-region; and
   the second electrode is on the insulating layer and is separated from the dummy bridge electrode by the insulating layer.

8. The touch panel of claim 7, wherein
   the dummy bridge electrode extends along the first direction onto a portion of the slope of the opening and is covered by the insulating layer.

9. The touch panel of claim 7, wherein
   in each of the plurality of second sub-regions, an orthographic projection of the dummy bridge electrode on the base has a substantially same size as an orthographic projection of the second electrode on the base.

10. The touch panel of claim 4, comprising a plurality of first repeating units,
    wherein each of the plurality of first repeating units comprises a first sub-region, a second region, a second sub-region, a second region, a second sub-region, a second region, and a first sub-region extending along the first direction.

11. The touch panel of claim 5, comprising a plurality of first repeating units,
    wherein each of the plurality of first repeating units comprises a first sub-region, a second region, a second sub-region, a second region, a second sub-region, a second region, and a first sub-region extending along the first direction.

12. The touch panel of claim 10, further comprising a plurality of second repeating units,
    wherein the plurality of second repeating units and the plurality of first repeating units are arranged side by side along a second direction intersecting with the first direction; and
    each of the plurality of second repeating units comprises a first sub-region, a second region, a second sub-region, a second region, a second sub-region, a second region, a second sub-region, a second region, and a first sub-region.

13. The touch panel of claim 11, further comprising a plurality of second repeating units,
    wherein the plurality of second repeating units and the plurality of first repeating units are arranged along a second direction intersecting with the first direction; and
    each of the plurality of second repeating units comprises a first sub-region, a second region, a second sub-region, a second region, a second sub-region, a second region, a second sub-region, a second region, and a first sub-region.

14. The touch panel of claim 1, wherein the color filter layers comprise red filter layers, green filter layers and blue filter layers, the color filter layers are arranged in an array with a column direction being the first direction and a row direction being the second direction;

the red filter layers, the green filter layers and the blue filter layers are alternately arranged in sequence along the first direction; the red filter layers, the green filter layers and the blue filter layers are alternately arranged in sequence along the second direction; and surfaces of the color filter layers, the insulating layer and the black matrix away from the base are flush with each other.

15. The touch panel of claim 14, wherein a color of the insulating layer, on either side of each of the color filter layers and adjacent to this color filter layer along each of the first direction and the second direction, is different from a color of this color filter layer.

16. The touch panel of claim 15, wherein the insulating layer comprises a first sub-portion and a second sub-portion; the first sub-portion and the second sub-portion are sequentially arranged along the first direction, and the first sub-portion and the second sub-portion are sequentially arranged along the second direction; and colors of materials of the first sub-portion and the second sub-portion are different from each other, and the color of each of the first sub-portion and the second sub-portion, on either side of each of the color filter layers and adjacent to this color filter layer along each of the first direction and the second direction, is different from a color of this color filter layer.

17. The touch panel of claim 15, wherein the insulating layer comprises a first sub-portion, a second sub-portion and a third sub-portion; and the first sub-portion, the second sub-portion and the third sub-portion are sequentially arranged along the first direction; and the first sub-portion, the second sub-portion and the third sub-portion are sequentially arranged along the second direction; and colors of materials of the first sub-portion, the second sub-portion and the third sub-portion are different from each other, and the color of each of the first sub-portion and the third sub-portion, on either side of each of the color filter layers and adjacent to this color filter layer along each of the first direction and the second direction, are different from a color of this color filter layer.

18. The touch panel of claim 15, wherein the insulating layer comprises a first sub-portion, a second sub-portion and a third sub-portion which are sequentially stacked in a direction away from the base; and colors of materials of the first sub-portion, the second sub-portion and the third sub-portion are different from each other.

19. The touch panel of claim 4, wherein the plurality of first electrodes are connected together through a plurality of first connecting lines in the first metal layer, to form a plurality of mesh structures of a plurality of columns of touch sensing electrodes extending along a second direction and arranged side by side along the first direction, each column of touch sensing electrodes comprises a plurality of touch sensing electrodes arranged side by side along the second direction, and every two adjacent touch sensing electrodes are connected to each other through a first bridge electrode in the first metal layer;

the plurality of second electrodes are connected together through a plurality of second connecting lines in the first metal layer, to form a plurality of mesh structures of a plurality of rows of touch driving electrodes extending along the first direction and arranged side by side along the second direction, each row of touch driving electrodes comprises a plurality of touch driving electrodes arranged side by side along the first direction, and every two adjacent touch driving electrodes are connected to each other through a second bridge electrode in the second metal layer;

the plurality of touch sensing electrodes and the plurality of touch driving electrodes are alternately arranged in the first direction and the second direction; and orthographic projections of the plurality of first bridge electrodes on the base overlap with orthographic projections of the plurality of second bridge electrodes on the base, respectively.

20. The touch panel of claim 5, wherein the plurality of first electrodes are connected together through a plurality of first connecting lines in the first metal layer, to form a plurality of mesh structures of a plurality of columns of touch sensing electrodes extending along a second direction and arranged side by side along the first direction, each column of touch sensing electrodes comprises a plurality of touch sensing electrodes arranged side by side along the second direction, and every two adjacent touch sensing electrodes are connected to each other through a first bridge electrode in the first metal layer;

the plurality of second electrodes are connected together through a plurality of second connecting lines in the first metal layer, to form a plurality of mesh structures of a plurality of rows of touch driving electrodes extending along the first direction and arranged side by side along the second direction, each row of touch driving electrodes comprises a plurality of touch driving electrodes arranged side by side along the first direction, and every two adjacent touch driving electrodes are connected to each other through a second bridge electrode in the second metal layer;

the plurality of touch sensing electrodes and the plurality of touch driving electrodes are alternately arranged in the first direction and the second direction; and orthographic projections of the plurality of first bridge electrodes on the base overlap with orthographic projections of the plurality of second bridge electrodes on the base, respectively.

* * * * *